(12) United States Patent
Chen et al.

(10) Patent No.: US 11,928,355 B2
(45) Date of Patent: Mar. 12, 2024

(54) METHOD AND APPARATUS FOR DETERMINING MISMATCH OF SENSE AMPLIFIER, STORAGE MEDIUM, AND ELECTRONIC EQUIPMENT

(71) Applicant: CHANGXIN MEMORY TECHNOLOGIES, INC., Hefei (CN)

(72) Inventors: Jian Chen, Hefei (CN); Chi-Shian Wu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 228 days.

(21) Appl. No.: 17/647,472

(22) Filed: Jan. 10, 2022

(65) Prior Publication Data

US 2022/0308786 A1 Sep. 29, 2022

Related U.S. Application Data

(63) Continuation of application No. PCT/CN2021/113647, filed on Aug. 19, 2021.

(30) Foreign Application Priority Data

Mar. 25, 2021 (CN) .......................... 202110321698.7

(51) Int. Cl.
*G11C 29/02* (2006.01)
*G06F 3/06* (2006.01)
(Continued)

(52) U.S. Cl.
CPC .......... *G06F 3/0653* (2013.01); *G06F 3/0604* (2013.01); *G06F 3/0655* (2013.01);
(Continued)

(58) Field of Classification Search
CPC ...................................................... G11C 7/065
(Continued)

(56) References Cited

U.S. PATENT DOCUMENTS 6,453,433 B1 9/2002 Vollrath
6,496,402 B1 12/2002 Somasekhar et al.
(Continued)

FOREIGN PATENT DOCUMENTS

CN 1572002 A 1/2005
CN 101751985 A 6/2010
(Continued)

OTHER PUBLICATIONS

International Search Report cited in PCT/CN2021/113647 dated Dec. 24, 2021, 12 pages.
(Continued)

*Primary Examiner* — Anthan Tran
(74) *Attorney, Agent, or Firm* — Cooper Legal Group, LLC (57) ABSTRACT

Disclosed are a method and apparatus for determining mismatch of a sense amplifier, a storage medium, and an electronic equipment, relating to the field of integrated circuit technology. The method for determining mismatch of a sense amplifier includes: determining a first signal threshold on a first bit line when a first memory cell executes write and read operations; determining a second signal threshold on a second bit line when a second memory cell executes write and read operations; and determining, according to the first signal threshold and the second signal threshold, whether the sense amplifier is mismatched. A method for determining whether the sense amplifier is mismatched is provided.

13 Claims, 5 Drawing Sheets

(51) Int. Cl.
*G11C 7/06* (2006.01)
*G11C 29/12* (2006.01)

(52) U.S. Cl.
CPC ............ *G06F 3/0673* (2013.01); *G11C 7/065* (2013.01); *G11C 29/026* (2013.01); *G11C 29/12* (2013.01)

(58) Field of Classification Search
USPC ....................................................... 365/207
See application file for complete search history.

(56) References Cited

U.S. PATENT DOCUMENTS

| | | |
|---|---|---|
| 7,688,656 B2 | 3/2010 | Zhang et al. |
| 8,605,526 B2 | 12/2013 | Huber et al. |
| 8,705,268 B2 | 4/2014 | Buer et al. |
| 9,093,175 B2 | 7/2015 | Barth, Jr. et al. |
| 10,255,987 B1 | 4/2019 | Fifield |
| 2009/0116325 A1 | 5/2009 | Jenkins et al. |
| 2010/0118631 A1 | 5/2010 | Kim et al. |
| 2021/0184871 A1* | 6/2021 | Kim ....................... G11C 7/062 |

FOREIGN PATENT DOCUMENTS

| | | |
|---|---|---|
| CN | 101836260 A | 9/2010 |
| CN | 102810335 A | 12/2012 |
| CN | 103187100 A | 7/2013 |
| CN | 109658970 A | 4/2019 |
| CN | 110223725 A | 9/2019 |
| CN | 112071356 A | 12/2020 |
| CN | 112885400 A | 6/2021 |
| CN | 112885401 A | 6/2021 |
| EP | 0947994 A2 | 3/1999 |
| EP | 0947994 A3 | 3/1999 |

OTHER PUBLICATIONS

International Search Report cited in PCT/CN2021/120399 dated Dec. 24, 2021, 11 pages.

* cited by examiner

METHOD AND APPARATUS FOR DETERMINING MISMATCH OF SENSE AMPLIFIER, STORAGE MEDIUM, AND ELECTRONIC EQUIPMENT

CROSS-REFERENCE TO RELATED APPLICATIONS

This is a continuation of International Application No. PCT/CN2021/113647, filed on Aug. 19, 2021, which claims the priority to Chinese Patent Application 202110321698.7, titled "METHOD AND APPARATUS FOR DETERMINING MISMATCH OF SENSE AMPLIFIER, STORAGE MEDIUM, AND ELECTRONIC EQUIPMENT" and filed on Mar. 25, 2021. The entire contents of International Application No. PCT/CN2021/113647 and Chinese Patent Application 202110321698.7 are incorporated herein by reference.

TECHNICAL FIELD

The present disclosure relates to the field of integrated circuit technology, and in particular, to a method and apparatus for determining mismatch of a sense amplifier, a storage medium, and an electronic equipment.

BACKGROUND

Dynamic Random Access Memory (DRAM) is a semiconductor memory device commonly used in computers and consists of many memory cells arranged in an array. Due to the relatively high density of the memory cell array, there are a variety of noises in a memory cell itself and between adjacent memory cells. These noises usually consume the signal margin of the memory cell, so that the actual available signal margin in the memory cell is reduced. If the actual available signal margin is too small, DRAM data access errors will be caused.

Among the noises, the noise caused by mismatch of a sense amplifier consumes the most signal margin. Therefore, determining whether the sense amplifier in the DRAM is mismatched is of great significance for the performance evaluation of the DRAM.

It should be noted that the information disclosed in the background section above is only used to enhance the understanding of the background of the present disclosure, and therefore may include information that does not constitute the prior art known to those of ordinary skill in the art.

SUMMARY

According to one aspect of the present disclosure, a method for determining mismatch of a sense amplifier is provided, the sense amplifier being connected to a first bit line and a second bit line, wherein the first bit line is located in a first memory cell, the second bit line is located in a second memory cell, and the method for determining mismatch of the sense amplifier includes: determining a first signal threshold on the first bit line when the first memory cell executes write and read operations; determining a second signal threshold on the second bit line when the second memory cell executes write and read operations; and determining, according to the first signal threshold and the second signal threshold, whether the sense amplifier is mismatched.

According to one aspect of the present disclosure, an apparatus for determining mismatch of a sense amplifier is provided, the sense amplifier being connected to a first bit line and a second bit line, wherein the first bit line is located in a first memory cell, the second bit line is located in a second memory cell, and the apparatus for determining mismatch of the sense amplifier includes: one or more processors; and a storage apparatus, configured to store one or more programs, wherein the one or more programs, when executed by the one or more processors, cause the one or more processors to execute operations of: determining a first signal threshold on the first bit line when the first memory cell executes write and read operations; determining a second signal threshold on the second bit line when the second memory cell executes write and read operations; and determining, according to the first signal threshold and the second signal threshold, whether the sense amplifier is mismatched.

According to one aspect of the present disclosure, a computer-readable storage medium is provided, storing a computer program thereon, when the computer program is executed by a processor, the above-mentioned method for determining mismatch of the sense amplifier is implemented.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and constitute a part of the specification, show embodiments consistent with the present disclosure, and are used to explain the principle of the present disclosure together with the specification. Apparently, the drawings described below are only some of the drawings of the present disclosure, and other drawings may also be obtained by those of ordinary skill in the art according to these drawings without any creative efforts. In the drawings.

DETAILED DESCRIPTION

Example embodiments are now described more comprehensively with reference to the accompanying drawings. However, the example embodiments can be implemented in various forms, and should not be construed as being limited to the embodiments set forth herein; on the contrary, the provision of these embodiments makes the present disclosure comprehensive and complete, and fully conveys the concept of the example embodiments to those skilled in the art. The same reference numerals in the drawings denote the same or similar parts, and repeated descriptions thereof are thereby omitted. In addition, the described features, structures or characteristics can be combined in one or more embodiments in any suitable way. In the following description, many specific details are provided to provide a sufficient understanding of the embodiments of the present disclosure. However, those skilled in the art would realize that the technical solutions of the present disclosure may be practiced without one or more of the specific details, or other methods, components, apparatuses, steps, etc. may be used. In other cases, well-known structures, methods, apparatuses, implementations, materials, or operations are not shown or described in detail to avoid obscuring various aspects of the present disclosure.

The block diagrams shown in the drawings are merely functional entities, and do not necessarily correspond to physically independent entities. That is, these functional entities may be implemented in the form of software, or these functional entities or part of these functional entities may be implemented in one or more software-hardened modules, or these functional entities may be implemented in different networks and/or processor units and/or microcontroller units.

Semiconductor memories are used in computers, servers, hand-held devices such as mobile phones, printers, and many other electronic equipment and applications. A semiconductor memory includes a plurality of memory cells in a memory array, and each memory cell stores at least one bit of information. DRAM is an example of such semiconductor memories. This solution is preferably used in DRAM. Therefore, the following embodiments are described with reference to DRAM as a non-limiting example.

In a DRAM integrated circuit device, memory cell arrays are typically arranged in rows and columns, so that a specific memory cell can be addressed by specifying a row and a column of its array. A word line connects a row to a set of bit line sense amplifier for detecting data in the cell. Then during a read operation, a subset of data in the sense amplifier is selected or "selected in columns" for output.

Each memory cell in DRAM usually includes a capacitor and a transistor. A gate of the transistor is connected to a word line, a drain is connected to a bit line, and a source is connected to a capacitor. A voltage signal on the word line can control the on or off of the transistor, and then data information stored in the capacitor is read through the bit line, or data information is written into the capacitor through the bit line for storage.

Figure 1:
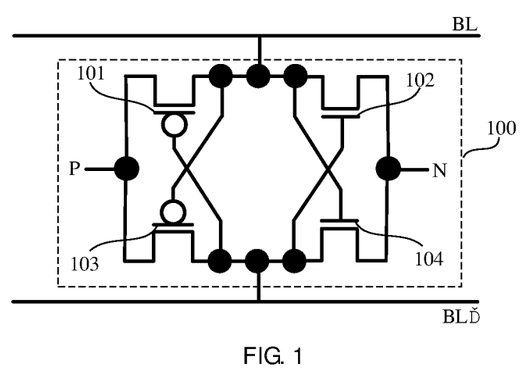
FIG. 1 schematically shows a structure diagram of a sense amplifier according to an exemplary embodiment of the present disclosure.

Referring to FIG. 1, a schematic structure diagram of a sense amplifier is shown. The Sense Amplifier (SA) may address a plurality of memory cells through lines called bit lines. The conventional read amplifier is more specifically a differential amplifier that operates by means of a bit line and a complementary bit line serving as a reference line to detect and amplify a voltage difference on the pair of bit lines, that is, amplify a voltage difference between a first bit line BL and a second bit line BL' connected to the sense amplifier.

The four transistors in the sense amplifier 100 in FIG. 1 are respectively a first transistor 101, a second transistor 102, a third transistor 103 and a fourth transistor 104, wherein the first transistor 101 and the third transistor 103 are both PMOS (Positive channel Metal Oxide Semiconductor) transistors, and the second transistor 102 and the fourth transistor 104 are both NMOS (Negative channel Metal Oxide Semiconductor) transistors. If data stored in a memory cell is 1, during a read operation, the voltage of the word line is first pulled up to Vccp, the transistor in the memory cell is turned on, and the memory cell is in a read/write active state. The voltage on the pair of bit lines BL and BL' is cut off. When 1 is read, a positive voltage is generated on the bit line BL. This voltage turns on the fourth transistor 104, so that the negative voltage on node N is added to the BL' line and the gate of the first transistor 101 and the first transistor 101 is turned on. Finally, the Vcc voltage on node P is added to the BL line, so that it can be easily and accurately determined whether the data stored in the memory cell is 1 or 0 according to whether the voltage difference on the pair of bit lines is +Vcc or −Vcc.

Figure 2:
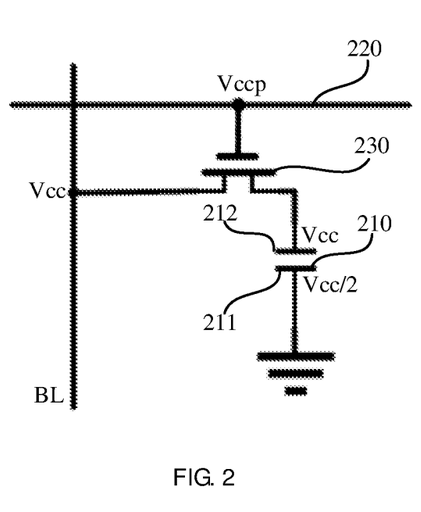
FIG. 2 schematically shows a first structure diagram of a write operation of a DRAM memory cell according to an exemplary embodiment of the present disclosure.
Figure 3:
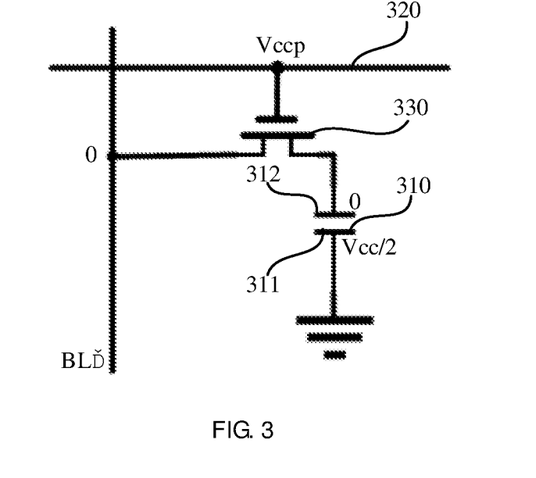
FIG. 3 schematically shows a second structure diagram of a write operation of a DRAM memory cell according to an exemplary embodiment of the present disclosure.

Generally, the two bit lines BL and BL' connected to the sense amplifier 100 are bit lines in two memory cells. That is, the first bit line BL is located in a first memory cell, and the second bit line BL' is located in a second memory cell. FIGS. 2 and 3 show structure diagrams of a memory cell. A voltage of Vcc/2 is always applied to one plate of a capacitor 210 or 310 in the DRAM memory cell. When a write operation is required for the memory cell, a voltage Vccp (>Vcc) is applied to the word line 220 or 320 of the memory cell, and the voltage Vccp will be applied to the gate of the transistor 230 or 330 of the memory cell. Usually the voltage Vccp is greater than the turn-on voltage of the transistor 230 or 330. Therefore, after the voltage Vccp is applied, the transistor 230 or 330 is turned on, so that the write operation can be performed on the memory cell.

For the capacitor 210, as shown in FIG. 2, when 1 is written, a voltage Vcc is applied to the bit line BL. This voltage Vcc will be conducted from the drain to the source of the turned-on transistor 230, and finally loaded to the other plate of the capacitor 210.

When 0 is written, a voltage of 0 V is applied to the bit line BL, so that the voltage on the other plate of the capacitor 210 is also 0 V. The process of writing 1 or 0 to the capacitor 310 is the same.

When 1 or 0 is written to the capacitor 310, the voltage in the plate of the capacitor 210 is 1 or 0. After the write is completed, the voltage of the BL returns to Vcc/2. When data is read, after the transistor 230 or 330 is turned on, the capacitor shares charges with the BL, so that the voltage of the BL changes. It can be determined whether the data stored in the memory cell is 1 or 0 according to the increase or decrease in the voltage of the BL.

Figure 4:
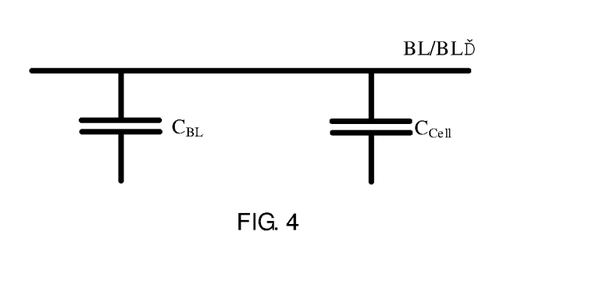
FIG. 4 schematically shows a first structure diagram of a read operation of a DRAM memory cell according to an exemplary embodiment of the present disclosure.

During the read operation in the DRAM memory cell, a voltage greater than the turn-on voltage of the transistor 230 or 330 also needs to be applied to the word line 220 or 320 of the memory cell to turn on the transistor 230 or 330. Then the charges on the capacitor 210 or 310 are released to the bit line BL or BL' through the transistor 230 or 330. In actual situations, referring to FIG. 4, the bit lines BL and BL' generate equivalent capacitances CBL, and voltage changes generated on the bit lines BL and BL' during the release of charges in the capacitor are as shown in formula (1):

$$\Delta V = (V_{cc}/2) \frac{C_{Cell}}{C_{Cell} + C_{BL}} \quad (1)$$

Where, $V_{cc}$ is a working voltage; $C_{Cell}$ is capacitance of the capacitor.

In actual situations, due to process reasons, threshold voltages between the second transistor 102 and the fourth transistor 104 composed of NMOS transistors are not completely the same, that is, there is a certain difference in threshold voltages between the second transistor 102 and the fourth transistor 104 and between the first transistor 101 and the third transistor 103, and the total of the differences is called mismatch of the sense amplifier. The mismatch of the sense amplifier will bring noise to the memory cell, and the sense amplifier will consume the theoretical signal margin during the read operation of the memory cell. If the theoretical signal margin consumed is too large, bit failure of the memory cell will be caused. Therefore, the determination of mismatch of the sense amplifier is of great significance for characteristic evaluation of the memory.

Figure 5:
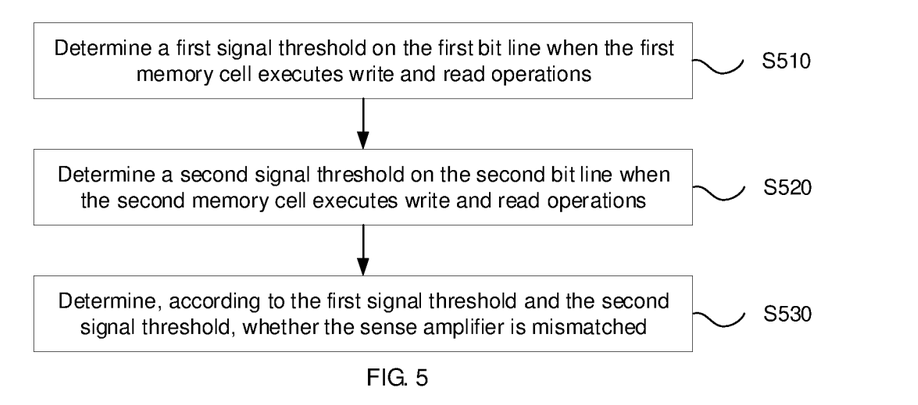
FIG. 5 schematically shows a flowchart of a method for determining mismatch of a sense amplifier according to an exemplary embodiment of the present disclosure.

Based on this, an exemplary embodiment of the present disclosure provides a method for determining mismatch of a sense amplifier. Referring to FIG. 5, the method for determining mismatch of a sense amplifier may include the following steps:

Step S510, determining a first signal threshold on the first bit line when the first memory cell executes write and read operations;

Step S520, determining a second signal threshold on the second bit line when the second memory cell executes write and read operations;

Step S530, determining, according to the first signal threshold and the second signal threshold, whether the sense amplifier is mismatched.

According to the method for determining mismatch of a sense amplifier in the exemplary embodiment of the present disclosure, a first signal threshold on the first bit line and a second signal threshold on the second bit line connected to the sense amplifier are determined, and the mismatch of the sense amplifier can be represented by the two signal thresholds, so that whether the sense amplifier is mismatched can be determined through the first signal threshold and the second signal threshold. The method for determining mismatch of a sense amplifier provides an evaluation basis for the performance of a memory, and also has certain guiding significance for improving the memory.

Hereinafter, the method for determining mismatch of a sense amplifier in an exemplary embodiment of the present disclosure will be further described.

In step S510, a first signal threshold on a first bit line is determined when a first memory cell executes write and read operations.

In an exemplary embodiment of the present disclosure, the first signal threshold refers to a voltage variation on a first bit line BL in the first memory cell under the condition that the remaining signal margin in the first memory cell cannot meet the requirement after the noise caused by the mismatch of the sense amplifier is consumed, and the first memory cell fails under the remaining signal margin.

In practical applications, if the first signal threshold is determined only by the failure of one first memory cell, the resulting error will be relatively large. Therefore, in the exemplary embodiment of the present disclosure, under the same conditions, the voltage variation on the first bit line BL in the first memory cell is determined when the number of failed bits in the memory where the first memory cell is located reaches a preset allowable number of failed bits.

Generally, the greater the density of memory cell arrays in a DRAM integrated circuit device is, the more the signal noises are therein, such as noises caused by data background coupling, electric leakage caused by long storage time, short write time, insufficient precharge time, SA mismatch, etc. These noises consume the theoretical voltage variation, that is, the theoretical signal margin (SM), which reduces the actual signal margin outputted. If the noises are too large to result in insufficient actual signal margin, data access errors will occur in the DRAM.

It is assumed the first memory cell is shown in FIG. 2, the plates of the capacitor 210 are named a first plate 211 and a second plate 212, the first plate 211 and the second plate 212 are arranged oppositely, and the second plate 212 is connected to the source of the transistor 230 in the first memory cell.

In an exemplary embodiment of the present disclosure, when the first memory cell executes write and read operations, the first signal threshold on the first bit line BL is determined by changing the voltage on the first plate 211 of the capacitor in the first memory cell. Meanwhile, the voltage on the capacitor plate in the second memory cell also needs to be kept unchanged, to keep the voltage on the second bit line BL' unchanged, so that the first signal threshold can be determined only based on the voltage variation on the first bit line BL in the first memory cell. During the determination, since the amplification of the voltage on the first bit line BL is completed by the first transistor 101 and the fourth transistor 104, the first signal threshold related only to the performance of the first transistor 101 and the fourth transistor 104 can be determined under the condition that the voltage on the second bit line BL' is kept unchanged.

The specific process of determining the first signal threshold on the first bit line includes: writing the same data into a plurality of memory cells of a memory where the first memory cell is located, setting data retention time as a first preset time, and setting signal timing time as a second preset time, and determining the first signal threshold.

In practical applications, if different data is written into the plurality of memory cells in the memory, the memory cells storing different data will affect each other, which will cause data background noise. In the exemplary embodiment of the present disclosure, the influence caused by the data background noise can be avoided by writing the same data into the plurality of memory cells of the memory.

In practical applications, if the data retention time in the memory cell is too long, the transistor in the memory cell may leak electricity, so that the charges stored on the capacitor are insufficient to correctly identify data, resulting in data corruption. In the exemplary embodiment of the present disclosure, the data retention time is set as the first preset time to reduce the data retention time and avoid electric leakage of the transistor, thereby avoiding the influence of data retention time noise.

The data retention time may be set with reference to JEDEC standards. In an exemplary embodiment of the present disclosure, the first preset time may be set to 8 ms. By setting the first preset time to the minimum, the influence of data retention time noise on the memory cell can be minimized.

In practical applications, the signal timing time includes a variety of operations performed by the memory cell. If the signal timing time is too short, the corresponding operation may not be completed, thereby affecting the accuracy of finally read data. In the exemplary embodiment of the present disclosure, the signal timing time is set as the second preset time to extend the time of each operation in the signal timing time and ensure the completeness of each operation in the signal timing time, thereby avoiding the influence of signal timing time noise.

The signal timing time may be set with reference to JEDEC standards. In an exemplary embodiment of the present disclosure, the second preset time is set to 50 ns. By setting the second preset time to the maximum, the influence of signal timing time noise on the memory cell can be reduced as much as possible.

Based on the above, by avoiding the influence of data background noise, minimizing the influence of data retention time noise on the memory cell, and reducing the influence of signal timing time noise on the memory cell, the first signal threshold related to the noise caused only by the mismatch of the sense amplifier can be determined in the absence of data background noise, data retention time noise and signal timing time noise.

In an exemplary embodiment of the present disclosure, the process of determining the first signal threshold includes: changing the voltage on the first plate 211 of the capacitor 210 in the first memory cell, to obtain a number of failed bits in the memory under the influence of different voltages. By changing the voltage on the first plate 211, the voltage difference between the first plate 211 and the second plate 212 can be changed, that is, the voltage difference between the two plates of the capacitor 210 can be changed. By changing the voltage difference between the two plates of the capacitor 210, the performance of the first transistor 101 and the fourth transistor 104 in the sense amplifier can be measured, which provides a basis for determining the mismatch of the sense amplifier.

In an exemplary embodiment of the present disclosure, changing the voltage on the first plate 211 of the capacitor 210 in the first memory cell includes: before the first memory cell executes a write operation, changing the voltage of the first plate 211 of the capacitor 210 in the first memory cell from a first voltage $V_1$ to a second voltage $V_2$; and before the first memory cell executes a read operation, changing the voltage of the first plate 211 back to the first voltage $V_1$.

Generally, before the first memory cell executes the write operation, the voltage on the first plate 211 is the first voltage $V_1$, and the magnitude of the first voltage $V_1$ is Vcc/2. If the Vcc/2=0.5V, the first voltage $V_1$=0.5V.

In an exemplary embodiment of the present disclosure, before the first memory cell executes the write operation, the first voltage $V_1$ needs to be changed to the second voltage $V_2$. For example, the first voltage $V_1$ of 0.5 V is changed to the second voltage $V_2$ of 0.8 V. Before the first memory cell executes the read operation, the voltage on the first plate 211 needs to be changed back to the first voltage $V_1$, i.e., the voltage on the first plate 211 needs to be changed from 0.8 V to 0.5 V.

As shown in FIG. 2, the voltage written in the second plate 212 is Vcc=1 V. During the write, the voltage on the first plate 211 is 0.8 V, the voltage on the second plate 212 is 1 V, then the voltage difference between the first plate 211 and the second plate 212 is −0.2 V. Since the voltage difference between the two plates of the capacitor is unchanged by changing the voltage on any one of the plates, when the voltage on the first plate 211 is changed from 0.8 V to 0.5 V, the voltage on the second plate 212 becomes 0.7 V, which keeps the voltage difference between the first plate 211 and the second plate 212 still −0.2 V.

By changing the voltage on the first plate 211, the voltage difference between the first plate 211 and the second plate 212 is changed, thereby changing signals to be amplified by the sense amplifier, which is equivalent to simulating the consumption of signals by the mismatch of the sense amplifier.

Figure 6:
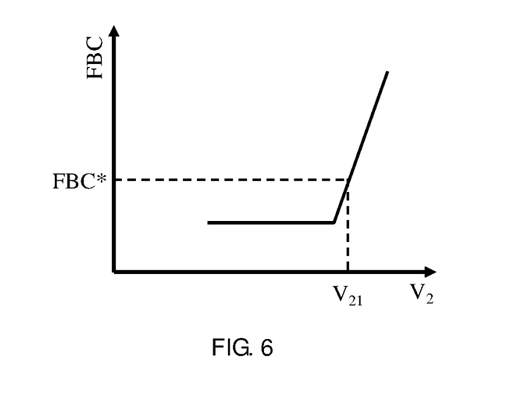
FIG. 6 schematically shows a change curve of the number of failed bits with a second voltage under the influence of mismatch of the sense amplifier according to an exemplary embodiment of the present disclosure.

In practical applications, the magnitude of the second voltage $V_2$ may be set according to the actual situation, and the number of failed bits FBC under the influence of different second voltages $V_2$ may be obtained by changing the magnitude of the second voltage $V_2$, referring to FIG. 6, which shows a change curve of the number of failed bits FBC with the second voltage $V_2$.

Based on the change curve of the number of failed bits FBC with the second voltage $V_2$ shown in FIG. 6, a critical voltage difference at which the sense amplifier is mismatched can be determined. Under the critical voltage difference, even if the sense amplifier amplifies the voltage difference, the data to be read cannot be correctly distinguished, which causes failure of the memory cell, that is, bit failure. If the number of failed bits FBC in the memory reaches a preset allowable number of failures FBC*, the voltage variation on the first bit line BL during the read operation of the first memory cell can be determined as the first signal threshold $V_{L1}$ according to the second voltage $V_{21}$ corresponding to the preset allowable number of failures FBC*. After the second voltage $V_2$ is greater than $V_{21}$, a large number of bits will fail, causing data read errors of the memory.

In practical applications, the number of failed bits FBC in the memory may be determined by counting the number of memory cells with different written data and read data. The number of failed bits FBC may also be determined in other ways, and the exemplary embodiments of the present disclosure do not limit this.

In practical applications, the preset allowable number of failures may be set according to actual situations. For example, the preset allowable number of failures is set to any number from one thousandth to one ten thousandth of the total number of memory cells in the memory. The exemplary embodiments of the present disclosure do not limit this. Similarly, the magnitude of the second voltage $V_2$ may be determined according to actual situations. For example, the second voltage $V_2$ may be any number between 0 and 1000 mV. In addition, the magnitude of the second voltage $V_2$ may be changed by means of a fixed step length, such as a step length of 10 mV, and may also be changed in other ways. The exemplary embodiments of the present disclosure do not limit this.

In an exemplary embodiment of the present disclosure, the magnitude of the first signal threshold $V_{L1}$ may be calculated according to formula (2):

$$V_{L1} = \frac{C_{Cell}}{C_{Cell} + C_{BL}} \times |V_A - V_B - (V_{21} - V_1)| \tag{2}$$

Where, $V_B$ is a voltage of the bit line before the word line is opened, and $V_A$ is a voltage of the bit line after the word line is opened and amplified by the sense amplifier.

Figure 7:
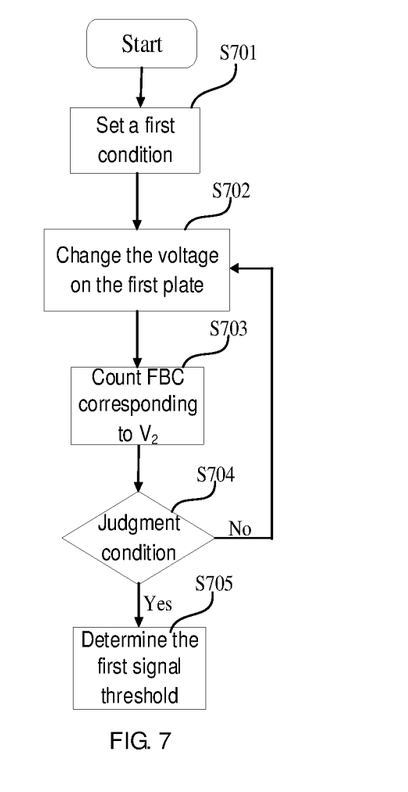
FIG. 7 schematically shows a flowchart of determining a first signal threshold under the influence of mismatch of the sense amplifier according to an exemplary embodiment of the present disclosure.

Referring to FIG. 7, a step flowchart of determining a first signal threshold provided by an exemplary embodiment of the present disclosure is shown. As shown in FIG. 7, in step S701, a first condition is set, the set first condition including: writing the same data into a plurality of memory cells of a memory where the first memory cell is located, setting data retention time as a first preset time, and setting signal timing time as a second preset time; in step S702, the voltage on the capacitor plate in the second memory cell is kept unchanged, and the voltage on the first plate of the capacitor in the first memory cell is changed, specifically including: before the first memory cell executes a write operation, changing the voltage of the first plate of the capacitor in the first memory cell from a first voltage to a second voltage $V_2$, and before the first memory cell executes a read operation, changing the voltage of the first plate back to the first voltage; in step S703, the number of failed bits FBC in the memory corresponding to the second voltage $V_2$ is calculated, that is, the FBC corresponding to $V_2$ is counted; in step S704, a judgment condition is entered, that is, whether the number of failed bits FBC reaches a preset allowable number of failures FBC* is judged; if not, step S702 is performed to continue to change the voltage on the first plate of the capacitor in the first memory cell; if yes, step S705 is performed to determine the first signal threshold, specifically including: determining the voltage variation on the first bit line of the first memory cell corresponding to the second voltage $V_2$ during the read operation as the first signal threshold.

In step S520, a second signal threshold on a second bit line is determined when a second memory cell executes write and read operations.

In an exemplary embodiment of the present disclosure, the second signal threshold refers to a voltage variation on a second bit line BL' in the second memory cell under the condition that the remaining signal margin in the second memory cell cannot meet the requirement after the noise caused by the mismatch of the sense amplifier is consumed, and the second memory cell fails under the remaining signal margin.

It is assumed the second memory cell is shown in FIG. 3, the plates of the capacitor 310 are named a third plate 311 and a fourth plate 312, the third plate 311 and the fourth plate 312 are arranged oppositely, and the fourth plate 312 is connected to the source of the transistor 230 in the second memory cell.

In an exemplary embodiment of the present disclosure, when the second memory cell executes write and read operations, the second signal threshold on the second bit line BL' is determined by changing the voltage on the third plate 311 of the capacitor in the second memory cell. Meanwhile, the voltage on the capacitor plate in the first memory cell also needs to be kept unchanged, to keep the voltage on the first bit line BL unchanged, so that the second signal threshold can be determined only based on the voltage variation on the second bit line BL' in the second memory cell. During the determination, since the amplification of the voltage on the second bit line BL' is completed by the second transistor 102 and the third transistor 103, the second signal threshold related only to the performance of the second transistor 102 and the third transistor 103 can be determined under the condition that the voltage on the first bit line BL is kept unchanged.

The specific process of determining the second signal threshold on the second bit line includes: writing the same data into a plurality of memory cells of a memory where the second memory cell is located, setting data retention time as a first preset time, and setting signal timing time as a second preset time, and determining the second signal threshold.

As mentioned above, by writing the same data into the plurality of memory cells, the influence of data background noise can be avoided; by setting data retention time as a first preset time, the influence of data retention time noise can be avoided; by setting signal timing time as a second preset time, the influence of signal timing time noise can be avoided. Therefore, the second signal threshold related to the noise caused only by the mismatch of the sense amplifier can be determined in the absence of data background noise, data retention time noise and signal timing time noise.

In an exemplary embodiment of the present disclosure, the process of determining the second signal threshold includes: changing the voltage on the third plate 311 of the capacitor 310 in the second memory cell, to obtain a number of failed bits in the memory under the influence of different voltages. By changing the voltage on the third plate 311, the voltage difference between the third plate 311 and the fourth plate 312 can be changed, that is, the voltage difference between the two plates of the capacitor 310 can be changed. By changing the voltage difference between the two plates of the capacitor 310, the performance of the second transistor 102 and the third transistor 103 in the sense amplifier can be measured, which provides a basis for determining the mismatch of the sense amplifier.

In an exemplary embodiment of the present disclosure, changing the voltage on the third plate 311 of the capacitor 310 in the second memory cell includes: before the second memory cell executes a write operation, changing the voltage of the third plate 311 of the capacitor 310 in the second memory cell from a third voltage $V_3$ to a fourth voltage $V_4$; and before the second memory cell executes a read operation, changing the voltage of the third plate 311 back to the third voltage $V_3$.

Generally, before the second memory cell executes the write operation, the voltage on the third plate 311 is the third voltage $V_3$, and the magnitude of the third voltage $V_3$ is Vcc/2. If the Vcc/2=0.5 V, the third voltage $V_3$=0.5 V.

In an exemplary embodiment of the present disclosure, before the second memory cell executes the write operation, the third voltage $V_3$ needs to be changed to the fourth voltage $V_4$. For example, the third voltage $V_3$ of 0.5 V is changed to the fourth voltage $V_4$ of 0.8 V. Before the second memory cell executes the read operation, the voltage on the third plate 311 needs to be changed back to the third voltage $V_3$, i.e., the voltage on the third plate 311 needs to be changed from 0.8 V to 0.5 V.

The voltage written in the fourth plate 312 is Vcc=1 V. During the write, the voltage on the third plate 311 is 0.8 V, and the voltage on the fourth plate 312 is 1 V, then the voltage difference between the third plate 311 and the fourth plate 312 is −0.2 V. Since the voltage difference between the two plates of the capacitor is unchanged by changing the voltage on any one of the plates, when the voltage on the third plate 311 is changed from 0.8 V to 0.5 V, the voltage on the fourth plate 312 becomes 0.7 V, which keeps the voltage difference between the third plate 311 and the fourth plate 312 still −0.2 V.

By changing the voltage on the third plate 311, the voltage difference between the third plate 311 and the fourth plate 312 is changed, thereby changing signals to be amplified by the sense amplifier, which is equivalent to simulating the consumption of signals by the mismatch of the sense amplifier.

Figure 8:
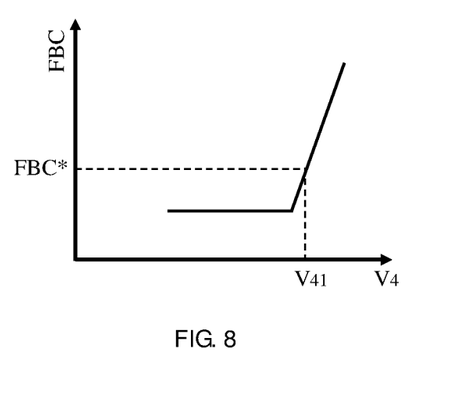
FIG. 8 schematically shows a change curve of the number of failed bits with a fourth voltage under the influence of mismatch of the sense amplifier according to an exemplary embodiment of the present disclosure.

In practical applications, the magnitude of the fourth voltage $V_4$ may be set according to the actual situation, and the number of failed bits FBC under the influence of different fourth voltages $V_4$ may be obtained by changing the magnitude of the fourth voltage $V_4$, referring to FIG. 8, which shows a change curve of the number of failed bits FBC with the fourth voltage $V_4$.

Based on the change curve of the number of failed bits FBC with the fourth voltage $V_4$ shown in FIG. 8, a critical voltage difference at which the sense amplifier is mismatched can be determined. Under the critical voltage difference, even if the sense amplifier amplifies the voltage difference, the data to be read cannot be correctly distinguished, which causes failure of the memory cell, that is, bit failure. If the number of failed bits FBC in the memory reaches a preset allowable number of failures FBC*, the voltage variation on the second bit line BL' during the read operation of the second memory cell can be determined as the second signal threshold $V_{L2}$ according to the fourth voltage $V_{41}$ corresponding to the preset allowable number of failures FBC*. After the fourth voltage $V_4$ is greater than $V_{41}$, a large number of bits will fail, causing data read errors of the memory.

In an exemplary embodiment of the present disclosure, the magnitude of the second signal threshold $V_{L2}$ may be calculated according to formula (3):

$$V_{L2} = \frac{C_{Cell}}{C_{Cell} + C_{BL}} \times |V_A - V_B - (V_{41} - V_1)| \quad (3)$$

Figure 9:
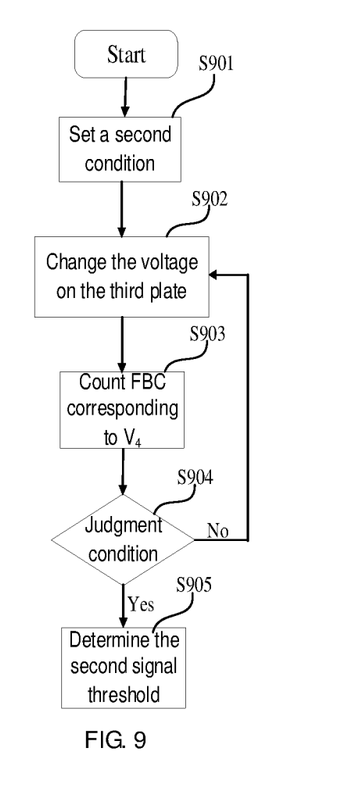
FIG. 9 schematically shows a flowchart of determining a second signal threshold under the influence of mismatch of the sense amplifier according to an exemplary embodiment of the present disclosure.

Referring to FIG. 9, a step flowchart of determining a second signal threshold provided by an exemplary embodiment of the present disclosure is shown. As shown in FIG. 9, in step S901, a second condition is set, the set second condition including: writing the same data into a plurality of memory cells of a memory where the second memory cell is located, setting data retention time as a first preset time, and setting signal timing time as a second preset time; in step S902, the voltage on the capacitor plate in the first memory cell is kept unchanged, and the voltage on the third plate of the capacitor in the second memory cell is changed, specifically including: before the second memory cell executes a write operation, changing the voltage of the third plate of the capacitor in the second memory cell from a third voltage to a fourth voltage $V_4$, and before the second memory cell executes a read operation, changing the voltage of the third plate back to the third voltage; in step S903, the number of failed bits FBC in the memory corresponding to the fourth voltage $V_4$ is calculated, that is, the FBC corresponding to $V_4$ is counted; in step S904, a judgment condition is entered, that is, whether the number of failed bits FBC reaches a preset allowable number of failures FBC* is judged; if not, step S902 is performed to continue to change the voltage on the third plate of the capacitor in the second memory cell; if yes, step S905 is performed to determine the second signal threshold, specifically including: determining the voltage variation on the second bit line of the second memory cell corresponding to the fourth voltage $V_4$ during the read operation as the second signal threshold.

In step S530, whether the sense amplifier is mismatched is determined according to the first signal threshold and the second signal threshold.

As mentioned above, the first signal threshold measures the performance of the first transistor 101 and the fourth transistor 104 in the sense amplifier, and the second signal threshold measures the performance of the second transistor 102 and the third transistor 103 in the sense amplifier. In actual situations, the mismatch of the sense amplifier is mainly caused by the voltage difference between the second transistor 102 and the fourth transistor 104, and the voltage difference between the first transistor 101 and the third transistor 103, so the mismatch of the sense amplifier can be confirmed through the difference between the first signal threshold and the second signal threshold.

Based on this, in an exemplary embodiment of the present disclosure, after the first signal threshold $V_{L1}$ on the first bit line BL and the second signal threshold $V_{L2}$ on the second bit line BL' are determined, the first signal threshold $V_{L1}$ and the second signal threshold $V_{L2}$ can compared to determine an absolute value of the difference between the first signal threshold $V_{L1}$ and the second signal threshold $V_{L2}$. If the absolute value of the difference is greater than or equal to a preset difference $V_P$, it can be determined that the sense amplifier is mismatched. The absolute value of the difference is calculated according to formula (4):

$$\Delta V_{12} = |V_{L1} - V_{L2}| = \frac{C_{Cell}}{C_{Cell} + C_{BL}} \times ||V_{41} - V_3| - |V_{21} - V_1|| \quad (4)$$

Whether the sense amplifier is mismatched is judged according to formula (5):

$$\Delta V_{12} \geq V_P \quad (5)$$

If the calculated absolute value of the difference satisfies formula (5), it indicates that the judged sense amplifier is mismatched.

In practical applications, the magnitude of the preset difference $V_P$ may be set according to actual situations, for example, the preset difference $V_P$ may be 0.1 to 100 mV, etc., which is not particularly limited in the exemplary embodiments of the present disclosure.

It should be noted that, in the exemplary embodiment of the present disclosure, since the first memory cell and the second memory cell are connected to the same sense amplifier, the memory where the first memory cell is located and the memory where the second memory cell is located are the same memory. In addition, in order to prevent errors caused by the difference between the first memory cell and the second memory cell, the first memory cell and the second memory cell are the same type of memory cells, and have the same performance.

Based on the above, the exemplary embodiment of the present disclosure obtains signal thresholds on two bit lines connected to the sense amplifier, and obtains a difference between the two signal thresholds, so as to judge the mismatch of the sense amplifier based on the difference, which provides a basis for determining the mismatch of the sense amplifier.

It should be noted that, although the various steps of the method in the present invention are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc.

Figure 10:
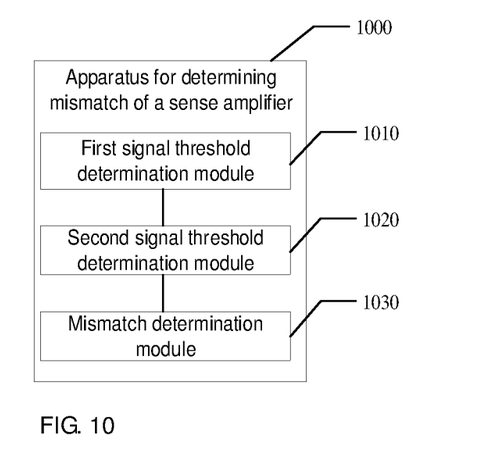
FIG. 10 schematically shows a block diagram of an apparatus for determining mismatch of a sense amplifier according to an exemplary embodiment of the present disclosure.

In addition, in this exemplary embodiment, an apparatus for determining mismatch of a sense amplifier is further provided. Referring to FIG. 10, the apparatus 1000 for determining mismatch of a sense amplifier is used to determine mismatch of a sense amplifier to which a first bit line and a second bit line are connected, wherein the first bit line is located in a first memory cell, and the second bit line is located in a second memory cell. The apparatus 1000 for determining mismatch of a sense amplifier may include: a first signal threshold determination module 1010, a second signal threshold determination module 1020, and a mismatch determination module 1030.

The first signal threshold determination module 1010 is configured to determine a first signal threshold on the first bit line when the first memory cell executes write and read operations;

The second signal threshold determination module 1020 is configured to determine a second signal threshold on the second bit line when the second memory cell executes write and read operations;

The mismatch determination module 1030 is configured to determine, according to the first signal threshold and the second signal threshold, whether the sense amplifier is mismatched.

The specific details of the virtual modules of the apparatus for determining mismatch of a sense amplifier are described in detail in the corresponding method for determining mismatch of a sense amplifier, and therefore will not be repeated here.

It should be noted that, although a number of modules or units of the apparatus for determining mismatch of a sense amplifier are mentioned in the above detailed description, this division is not mandatory. In fact, according to the embodiments of the present disclosure, the features and functions of two or more modules or units described above may be embodied in one module or unit. Conversely, the features and functions of a module or unit described above may be further divided into multiple modules or units to be embodied.

In an exemplary embodiment of the present disclosure, an electronic equipment capable of implementing the above method is further provided.

It could be appreciated by those skilled in the art that various aspects of the present invention may be implemented as systems, methods, or program products. Therefore, the various aspects of the present invention may be implemented in the following forms: complete hardware implementations, complete software implementations (including firmware, microcodes, etc.), or combined implementations of hardware and software, which may be collectively referred to as "circuits", "modules", or "systems" herein.

The electronic equipment 1100 according to this embodiment of the present invention will be described below with reference to FIG. 11. The electronic equipment 1100 shown in FIG. 11 is just an example, which does not impose any restrictions on the functions and scope of application of the embodiment of the present invention.

Figure 11:
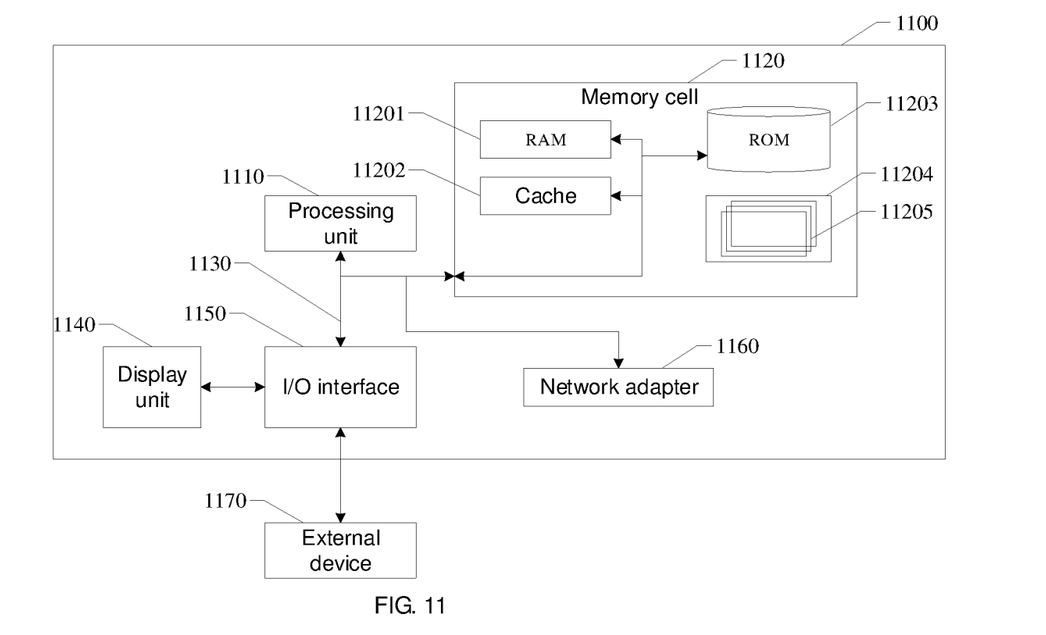
FIG. 11 schematically shows a schematic diagram of modules of an electronic equipment according to an exemplary embodiment of the present disclosure.

As shown in FIG. 11, the electronic equipment 1100 is embodied in the form of a general-purpose computing device. The components of the electronic equipment 1100 may include, but are not limited to: the aforementioned at least one processing unit 1110, the aforementioned at least one memory cell 1120, a bus 1130 connecting different system components (including the memory cell 1120 and the processing unit 1110), and a display unit 1140.

The memory cell 1120 stores program codes, and the program codes may be executed by the processing unit 1110, so that the processing unit 2010 performs the steps according to various exemplary implementations of the present invention described in the "exemplary method" section of the specification. For example, the processing unit 1110 may perform the steps as shown in FIG. 5: step S510, determining a first signal threshold on the first bit line when the first memory cell executes write and read operations; step S520, determining a second signal threshold on the second bit line when the second memory cell executes write and read operations; and step S530, determining, according to the first signal threshold and the second signal threshold, whether the sense amplifier is mismatched.

The memory cell 1120 may include a readable medium in the form of a volatile memory unit, such as a random access memory (RAM) 11201 and/or a cache 11202, and may further include a read-only memory (ROM) 11203.

The memory cell 1120 may also include a program/utility tool 11204 having a set (at least one) of program modules 11205, such program module 11205 including, but not limited to an operating system, one or more applications, other program modules, and program data. Each one or a combination of these examples may include the implementation of a network environment.

The bus 1130 may represent one or more of several types of bus structures, including a memory unit bus or memory unit controller, a peripheral bus, a graphics acceleration port, a processing unit, or a local area bus using any of a variety of bus structures.

The electronic equipment 1100 may also communicate with one or more external devices 1170 (e.g., a keyboard, a pointing device, a Bluetooth device, etc.), and may also communicate with one or more devices that enable a user to interact with the electronic equipment 1100, and/or communicate with any device (e.g., a router, a modem, etc.) that enables the electronic equipment 1100 to communicate with one or more other computing devices. The communication may be performed via an input/output (I/O) interface 1150. In addition, the electronic equipment 1100 may also communicate with one or more networks (for example, a local area network (LAN), a wide area network (WAN), and/or a public network, such as the Internet) via a network adapter 1160. As shown in the figure, the network adapter 1160 communicates with other modules of the electronic equipment 1100 via the bus 1130. It should be understood that although not shown in the figure, other hardware and/or software modules may be used in combination with the electronic equipment 1100, including but not limited to: microcodes, a device driver, a redundant processing unit, an external disk drive array, a RAID system, a tape driver, a data backup storage system, etc.

Through the description of the above embodiments, those skilled in the art can easily understand that the example embodiments described here can be implemented by software, or can be implemented by combining software with necessary hardware. Therefore, the technical solution according to the embodiments of the present disclosure may be embodied in the form of a software product, and the software product may be stored in a non-volatile storage medium (which may be a CD-ROM, a U disk, a mobile hard disk, etc.) or on the network, and includes instructions enabling a computing device (which may be a personal computer, a server, a terminal device, or a network device, etc.) to execute the method according to the embodiments of the present disclosure.

In an exemplary embodiment of the present disclosure, a computer-readable storage medium is further provided, storing a program product capable of implementing the above-mentioned method in this specification. In some possible implementations, various aspects of the present invention may also be implemented in the form of a program product, which includes program codes. When the program product runs on a terminal device, the program codes are used to enable the terminal device to execute the steps according to various exemplary implementations of the present invention described in the "exemplary method" section of the specification.

The program product for implementing the above method according to the implementations of the present invention may adopt a portable compact disk read-only memory (CD-ROM) and include program codes, and may run on a terminal device, such as a personal computer. However, the program product of the present invention is not limited to this. Herein, the readable storage medium may be any tangible medium that includes or stores a program, and the program may be used by or combined with an instruction execution system, apparatus or device.

The program product may adopt one readable medium or any combination of one or more readable media. The readable medium may be a readable signal medium or a readable storage medium. An example of the readable storage medium may be, but is not limited to electric, magnetic, optical, electromagnetic, infrared, or semiconductor systems, apparatuses or devices, or any combination of the above. A more specific example (a non-exhaustive list) of the readable storage medium may comprise: an electrical connection with one or more wires, a portable disk, a hard disk, a random access memory (RAM), a read-only memory (ROM), an erasable programmable read-only memory (EPROM or flash memory), a fiber, a portable compact disk read-only memory (CD-ROM), an optical memory, a magnetic memory, or any suitable combination of the above.

The computer-readable signal medium may include data signals in a baseband or propagated as part of carriers, in which readable program codes are carried. The propagated data signals may be in various forms, including but not limited to electromagnetic signals, optical signals or any suitable combination thereof. The readable signal medium may also be any readable medium beyond the readable storage media. The readable medium is capable of sending, propagating or transmitting a program used by or in combination with an instruction execution system, apparatus or device or a combination thereof.

The program codes included in the readable medium may be transmitted by any appropriate medium, including but not limited to wireless, wired, optical cable, RF, etc., or any appropriate combination of the above.

The program codes for executing operations of the present invention may be compiled in one or more programming languages. The programming languages include object-oriented programming languages, such as Java and C++, and also include conventional procedural programming languages, such as "C" language or similar programming languages. The program code may be completely executed on a user's computing device, partially executed on a user's device, executed as a separate software package, partially executed on a user's computing device and partially executed on a remote computing device, or completely executed on a remote computing device or server. In the circumstance involving a remote computing device, the remote computing device may be connected to a user's computing device over any type of network, including a local area network (LAN) or wide area network (WAN), or may be connected to an external computing device (for example, connected over the Internet by means of an Internet service provider).

In addition, the above drawings are merely schematic illustrations of the processes included in the method according to the exemplary embodiments of the present invention, and are not intended for limitation. It is easy to understand that the processes shown in the above drawings do not indicate or limit the time sequence of the processes. In addition, it is also easy to understand that these processes may be executed synchronously or asynchronously in multiple modules, for example.

A person skilled in the art would readily conceive of other embodiments of the present disclosure after considering the specification and practicing the invention disclosed herein. The present application is intended to cover any variations, uses or adaptive changes of the present disclosure. These variations, uses or adaptive changes follow the general principle of the present disclosure and include common general knowledge or conventional technical means in the technical field that are not disclosed in the present disclosure. The description and the embodiments are only regarded as exemplary, and the true scope and spirit of the present disclosure are indicated by the claims. It should be understood that the present disclosure is not limited to the precise structure described above and shown in the drawings, and various modifications and changes can be made without departing from its scope. The scope of the present disclosure is only limited by the appended claims.

The invention claimed is:

1. A method for determining mismatch of a sense amplifier, the sense amplifier being connected to a first bit line and a second bit line, wherein the first bit line is located in a first memory cell, the second bit line is located in a second memory cell, and the method for determining mismatch of the sense amplifier comprises:
   determining a first signal threshold on the first bit line when the first memory cell executes write and read operations;
   determining a second signal threshold on the second bit line when the second memory cell executes write and read operations; and
   determining, according to the first signal threshold and the second signal threshold, whether the sense amplifier is mismatched;
   wherein determining the first signal threshold on the first bit line when the first memory cell executes write and read operations comprises:
   writing same data into a plurality of memory cells of a memory where the first memory cell is located; and
   setting data retention time as a first preset time, setting signal timing time as a second preset time, and determining the first signal threshold.

2. The method for determining mismatch of the sense amplifier of claim 1, wherein determining the first signal threshold comprises:
   keeping a voltage on a capacitor plate in the second memory cell unchanged, changing a voltage on a first plate of a capacitor in the first memory cell, and obtaining a number of failed bits in the memory under influence of different voltages; wherein, a second plate of the capacitor in the first memory cell is connected to a source of a transistor in the first memory cell, and the first plate is arranged opposite to the second plate; and
   when the number of failed bits reaches a preset allowable number of failures, determining a voltage variation on the first bit line during the read operation of the first memory cell as the first signal threshold.

3. The method for determining mismatch of the sense amplifier of claim 2, wherein changing the voltage on the first plate of the capacitor in the first memory cell comprises:
before the first memory cell executes the write operation, changing the voltage of the first plate of the capacitor in the first memory cell from a first voltage to a second voltage; and
before the first memory cell executes the read operation, changing the voltage of the first plate back to the first voltage.

4. The method for determining mismatch of the sense amplifier of claim 3, wherein obtaining the number of failed bits in the memory under the influence of different voltages comprises:
changing a magnitude of the second voltage, and obtaining the number of failed bits under influence of different second voltages.

5. The method for determining mismatch of the sense amplifier of claim 1, wherein determining the second signal threshold on the second bit line when the second memory cell executes write and read operations comprises:
writing same data into a second plurality of memory cells of a second memory where the second memory cell is located; and
setting second data retention time as the first preset time, setting second signal timing time as the second preset time, and determining the second signal threshold.

6. The method for determining mismatch of the sense amplifier of claim 5, wherein determining the second signal threshold comprises:
keeping a voltage on a capacitor plate in the first memory cell unchanged, changing a voltage on a third plate of a capacitor in the second memory cell, and obtaining a number of failed bits in the second memory under influence of different voltages; wherein, a fourth plate of the capacitor in the second memory cell is connected to a source of a transistor in the second memory cell, and the third plate is arranged opposite to the fourth plate; and
when the number of failed bits reaches a preset allowable number of failures, determining a voltage variation on the second bit line during the read operation of the second memory cell as the second signal threshold.

7. The method for determining mismatch of the sense amplifier of claim 6, wherein changing the voltage on the third plate of the capacitor in the second memory cell comprises:
before the second memory cell executes the write operation, changing the voltage of the third plate of the capacitor in the second memory cell from a third voltage to a fourth voltage; and
before the second memory cell executes the read operation, changing the voltage of the third plate back to the third voltage.

8. The method for determining mismatch of the sense amplifier of claim 7, wherein obtaining the number of failed bits in the second memory under the influence of different voltages comprises:
changing a magnitude of the fourth voltage, and obtaining the number of failed bits under influence of different fourth voltages.

9. The method for determining mismatch of the sense amplifier of claim 1, wherein determining, according to the first signal threshold and the second signal threshold, whether the sense amplifier is mismatched comprises:
determining a difference between the first signal threshold and the second signal threshold, and when the difference is greater than or equal to a preset difference, determining that the sense amplifier is mismatched.

10. The method for determining mismatch of the sense amplifier of claim 1, wherein the first memory cell and the second memory cell are a same type of memory cells.

11. The method for determining mismatch of the sense amplifier of claim 1, wherein the memory where the first memory cell is located and a memory where the second memory cell is located are a same memory.

12. An apparatus for determining mismatch of a sense amplifier, the sense amplifier being connected to a first bit line and a second bit line, wherein the first bit line is located in a first memory cell, the second bit line is located in a second memory cell, and the apparatus for determining mismatch of the sense amplifier comprises:
one or more processors; and
a storage apparatus, configured to store one or more programs, wherein the one or more programs, when executed by the one or more processors, cause the one or more processors to execute operations of:
determining a first signal threshold on the first bit line when the first memory cell executes write and read operations;
determining a second signal threshold on the second bit line when the second memory cell executes write and read operations; and
determining, according to the first signal threshold and the second signal threshold, whether the sense amplifier is mismatched;
wherein determining the first signal threshold on the first bit line when the first memory cell executes write and read operations comprises:
writing same data into a plurality of memory cells of a memory where the first memory cell is located; and
setting data retention time as a first preset time, setting signal timing time as a second preset time, and determining the first signal threshold.

13. A non-transitory computer-readable storage medium, storing a computer program thereon, wherein when the computer program is executed by a processor, the method for determining mismatch of the sense amplifier of claim 1 is implemented.

* * * * *